United States Patent
Zhang et al.

(10) Patent No.: US 9,473,149 B1
(45) Date of Patent: Oct. 18, 2016

(54) TEMPERATURE-COMPENSATED SIGNAL GENERATOR FOR SUPPLY VOLTAGE MONITORING

(71) Applicant: QUALCOMM Incorporated, San Diego, CA (US)

(72) Inventors: Junmou Zhang, San Diego, CA (US); Taesik Na, Atlanta, GA (US); Guoan Zhong, San Diego, CA (US); Nan Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/991,790

(22) Filed: Jan. 8, 2016

(51) Int. Cl.
  *H03L 1/02*   (2006.01)
  *H03K 3/03*   (2006.01)
  *G05F 3/26*   (2006.01)

(52) U.S. Cl.
  CPC .............. *H03L 1/022* (2013.01); *G05F 3/262* (2013.01); *H03K 3/0315* (2013.01)

(58) Field of Classification Search
  CPC ........................................ H03L 1/02

USPC .................... 331/176, 57, 186, 183
See application file for complete search history.

(56) References Cited

U.S. PATENT DOCUMENTS

| | | |
|---|---|---|
| 5,180,995 A | 1/1993 | Hayashi et al. |
| 6,759,875 B2 | 7/2004 | Mano et al. |
| 7,167,058 B2 | 1/2007 | Meltzer |
| 8,044,740 B2 | 10/2011 | Zhu |
| 8,218,375 B2 | 7/2012 | Joo et al. |
| 2009/0051443 A1* | 2/2009 | Illegems ............... H03K 3/011 331/57 |
| 2015/0137896 A1* | 5/2015 | Gajda ...................... H03L 1/02 331/57 |

* cited by examiner

*Primary Examiner* — Joseph Chang
(74) *Attorney, Agent, or Firm* — Loza & Loza LLP

(57) ABSTRACT

A signal generator configured to generate an oscillating signal with a temperature-compensated frequency. The signal generator includes a ring oscillator, and a complementary to absolute temperature (CTAT) current generator configured to generate a CTAT current for the ring oscillator to temperature-compensate the frequency of the oscillating signal.

24 Claims, 6 Drawing Sheets

TEMPERATURE-COMPENSATED SIGNAL GENERATOR FOR SUPPLY VOLTAGE MONITORING

BACKGROUND

1. Field

Aspects of the present disclosure relate generally to oscillators or signal generators, and more particularly, to a temperature-compensated signal generator for supply voltage monitoring or other purposes.

2. Background

Often, there are situations where a direct current (DC) supply voltage from a power source (e.g., a battery, a voltage regulator, etc.) should be monitored to detect abnormalities in the supply voltage and perform some corrective action (e.g., provide a warning, disable one or more circuits, etc.). Some examples of abnormalities include an over-voltage condition, an under-voltage condition, voltage glitches (intentional and unintentional), etc.

A typical circuit for monitoring a supply voltage for the purpose of detecting abnormalities includes an oscillator (e.g., a ring oscillator) and a frequency-to-digital converter (FDC). The oscillator generates an oscillating signal having a frequency, the frequency being a function of the supply voltage. For example, the frequency of the oscillating signal may increase or decrease with an increase or decrease in the supply voltage, respectively. The FDC generates a digital output code or value indicative of the supply voltage based on the frequency of the oscillating signal generated by the oscillator. By monitoring the digital output code produced by the FDC, abnormalities (e.g., over-voltage condition, under-voltage condition, voltage glitches, etc.) may be detected.

For the supply voltage monitoring circuit to operate accurately, the frequency of the oscillating signal should not vary significantly over an operating temperature range of the circuit. Otherwise, a significant temperature change within the operating range may be misinterpreted as an abnormality in the power supply voltage. Accordingly, there is a need to temperature-compensate the frequency of an oscillating signal generated by an oscillator used for supply voltage monitoring or other purposes.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus comprising an oscillator configured to generate an oscillating signal; and a complementary to absolute temperature (CTAT) current generator configured to supply a CTAT current to the oscillator to temperature compensate the frequency of the oscillating signal.

Another aspect of the disclosure relates to a method comprising generating an oscillating signal; and providing a complementary to absolute temperature (CTAT) current to temperature-compensate the frequency of the oscillating signal.

Another aspect of the disclosure relates to an apparatus comprising means for generating an oscillating signal; and means for providing a complementary to absolute temperature (CTAT) current to temperature-compensate the frequency of the oscillating signal.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
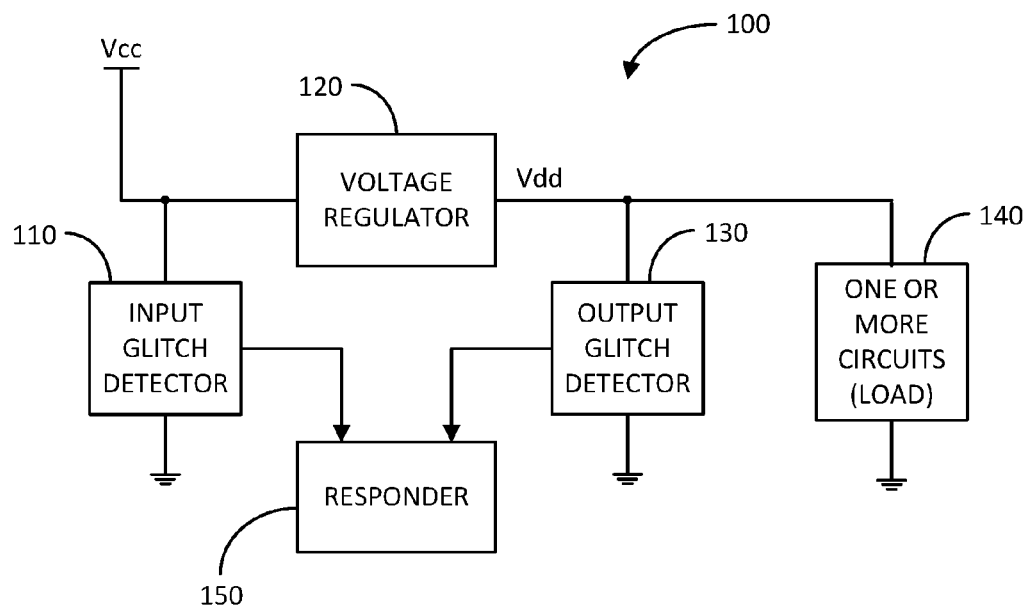
FIG. 1 illustrates a block diagram of an exemplary apparatus including circuitry for monitoring and responding to abnormalities present in external and internal power supply voltages Vcc and Vdd in accordance with an aspect of the disclosure.

FIG. 1 illustrates a block diagram of an exemplary apparatus 100 including circuitry for monitoring and responding to abnormalities present in external and internal power supply voltages Vcc and Vdd in accordance with an aspect of the disclosure. As an example of a supply voltage abnormality, an attacker may intentionally introduce glitches (e.g., rapid rise or fall in the supply voltage Vcc) to achieve faults in the operation of one or more circuits that use the supply voltage Vcc for power. It shall be understood that other types of abnormalities (e.g., over-voltage condition, under-voltage condition, etc.) may be detected with the circuitry employed by apparatus 100.

In particular, the apparatus 100 includes a voltage regulator 120 configured to receive an external power supply voltage Vcc. The voltage regulator 120 generates an internal supply voltage Vdd by processing (e.g., regulating, filtering, etc.) the external power supply voltage Vcc. The internal supply voltage Vdd is applied to one or more circuits 140 (generally, a load) so that the one or more circuits may perform their intended operations.

As discussed, an attacker may introduce voltage glitches into the external power supply voltage Vcc in order to produce faults in the operations of the one or more circuits 140. Although the voltage regulator 120, through its regulation and filtering capabilities, may prevent some of the glitches from being produced in the internal power supply voltage Vdd, the voltage regulator 120 might not prevent all of the glitches from ending up in the internal supply voltage Vdd.

Accordingly, the apparatus 100 further includes an input glitch detector 110 and an output glitch detector 130. The input glitch detector 110 is configured to detect one or more glitches in the external power supply voltage Vcc. The output glitch detector 130 is configured to detect one or more glitches in the internal supply voltage Vdd.

The apparatus 100 further includes a responder 150 configured to perform one or more defined operations based on the detection of one or more glitches by the input glitch detector 110 and/or the output glitch detector 130. Such operations may include sounding an alarm, disabling one or more of the circuits 140, and/or performing other corrective actions.

Figure 2:
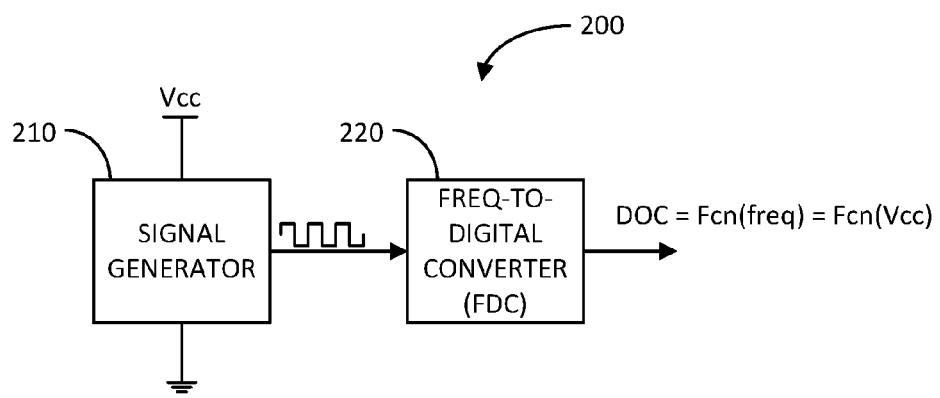
FIG. 2 illustrates a block diagram of an exemplary apparatus for monitoring a power supply voltage in accordance with another aspect of the disclosure.

FIG. 2 illustrates a block diagram of an exemplary apparatus 200 for monitoring a supply voltage in accordance with another aspect of the disclosure. The supply voltage apparatus 200 may be an exemplary detailed implementation of any of the glitch detectors 110 and 130 previously discussed. In particular, the apparatus 200 includes a signal generator 210 and a frequency-to-digital converter (FDC) 220. The signal generator 210, which may be configured as a ring oscillator, generates a signal (e.g., a substantially square wave signal), whose frequency varies as a function of the external power supply voltage Vcc (or Vdd, if coupled to the internal power supply voltage).

The FDC 220 receives the signal and generates a digital output code (DOC) that is a function of the frequency of the signal. Accordingly, since the DOC is a function of the frequency of the signal, and, the frequency of the signal is a function of the supply voltage Vcc, then the DOC is a function of the supply voltage Vcc (e.g., DOC=Fcn(freq)=Fcn(Vcc)). The apparatus 200 may detect glitches by monitoring the DOC to determine whether the power supply voltage has rapidly changed in accordance with a glitch definition.

Figure 3:
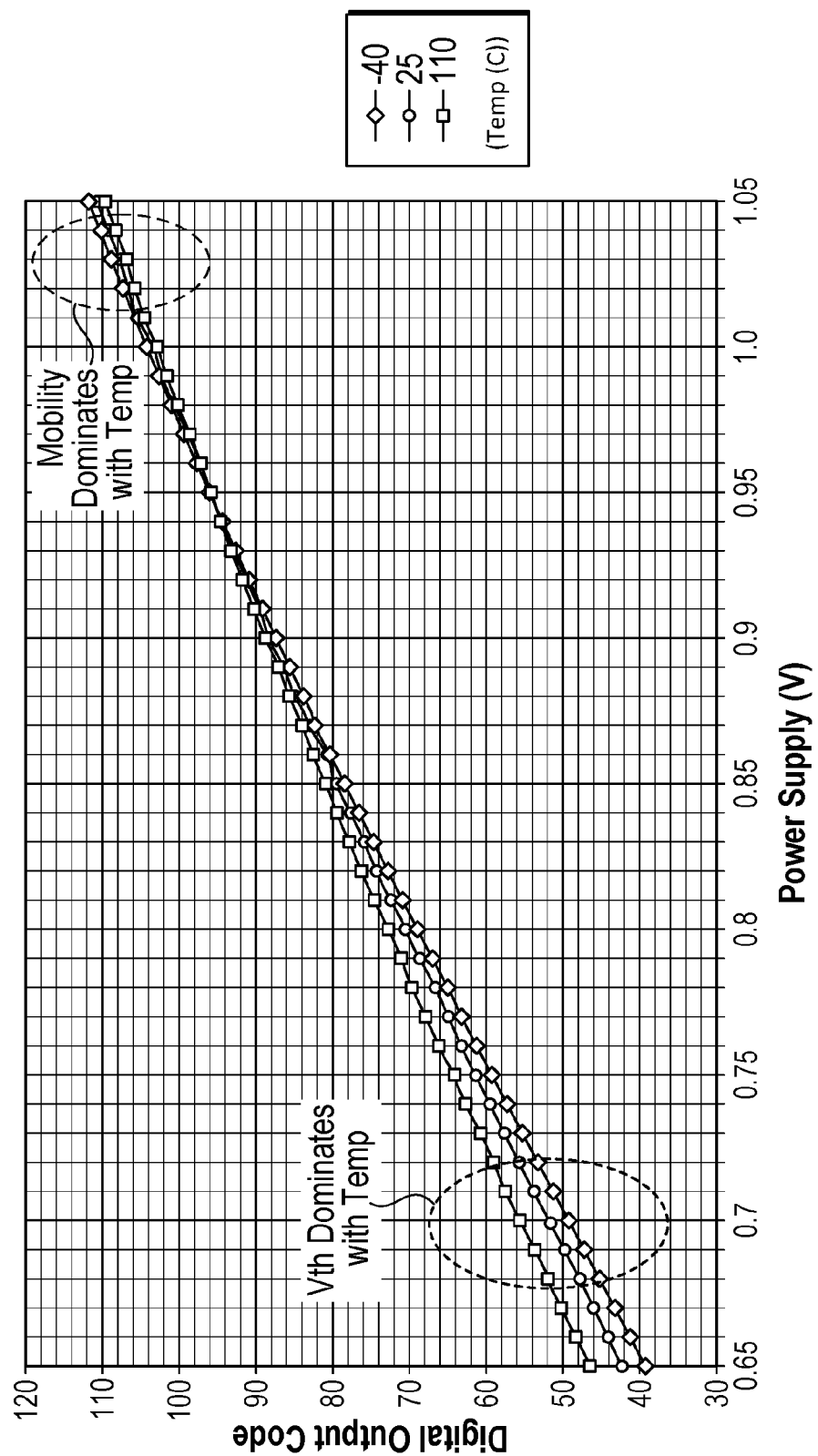
FIG. 3 illustrates a graph of a digital output code (y-axis) generated by an exemplary supply voltage monitoring apparatus based on a power supply voltage Vcc (x-axis) in accordance with another aspect of the disclosure.

FIG. 3 illustrates a graph of the digital output code (DOC) (y-axis) generated by the supply voltage monitoring apparatus 200 based on the power supply voltage Vcc (x-axis) in accordance with another aspect of the disclosure. As the graph illustrates, given a particular operating temperature for the apparatus 200, the DOC increases non-linearly with the supply voltage Vcc.

With regard to variation of the DOC with temperature, at lower values of the power supply voltage Vcc, the DOC increases with temperature (e.g., the DOC has a positive temperature coefficient). This is because in this supply voltage region, the threshold voltage Vth of the FETs used in the signal generator 210 (e.g., ring oscillator) dominates the value of the DOC with temperature. As Vth decreases with increasing temperature, the DOC (e.g., the frequency of the signal generated by the ring oscillator 210) increases. Conversely, as Vth increases with decreasing temperature, the DOC or frequency of the signal decreases. That is, at this lower supply voltage range, the frequency of the oscillating signal generated by the signal generator has a positive temperature coefficient.

At higher values of the power supply voltage Vcc, the mobility of the carriers in the FETs of the signal generator 210 (e.g., ring oscillator) dominates with temperature. Accordingly, as the mobility of the carriers decreases with higher temperature, the DOC (e.g., the frequency of the signal generated by the ring oscillator 210) decreases. Conversely, as the mobility of the carriers increases with lower temperature, the DOC or frequency of the signal decreases. That is, at this higher supply voltage range, the frequency of the oscillating signal generated by the signal generator has a negative temperature coefficient.

Based on the graph, it is desirable for the signal generator 210 (e.g., ring oscillator) to operate in a lower region of the power supply voltage Vcc to reduce power consumption; in which case, the frequency of the signal generated by the signal generator 210 has a positive temperature coefficient.

Figure 4:
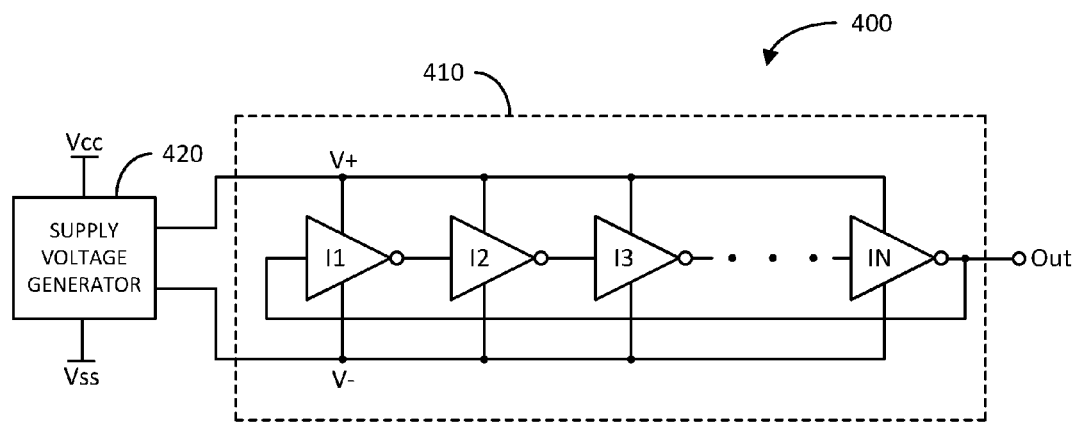
FIG. 4 illustrates a block diagram of an exemplary signal generator in accordance with another aspect of the disclosure.

FIG. 4 illustrates a block diagram of an exemplary signal generator 400 in accordance with another aspect of the disclosure. The signal generator 400 may be one exemplary detailed implementation of the signal generator 210 previously discussed. In particular, the signal generator 400 includes an oscillator 410 and a supply voltage generator 420.

The oscillator 410 may be configured as a ring oscillator. For example, the oscillator 410 comprises an odd integer number N of cascaded inverters I1 to IN. With the exception of the last inverter IN, the output of each of the inverter is coupled to the input of the next or following inverter. The output of the last inverter IN is fed back to the input of the first inverter I1. The oscillator 410 is configured to generate an oscillating signal at the output of the last inverter IN (and more generally, at the output of each of the inverters I1 to IN). The frequency of the oscillating signal generated by the ring oscillator 410 may be given by $1/(2*D*N)$, where D is the signal propagation delay of each of the inverters I1 to IN, and N is the number of inverters in the ring oscillator.

The supply voltage generator 420 generates a supply voltage (V+−V−) for the ring oscillator 410 based on an input supply voltage (Vcc−Vss). For example, the supply voltage components V+ and V− are applied to first and second voltage rails of the ring oscillator 410, respectively. The input supply voltage components Vcc and Vss are applied to first and second voltage rails of the supply voltage generator 420, respectively.

As an example, the supply voltage generator 420 is configured to generate a reduced supply voltage (V+−V−) such that the ring oscillator 410 is configured to operate in a threshold voltage Vth dominated temperature region as discussed with the graph depicted in FIG. 3. In such region, the frequency of the oscillating signal generated by the ring oscillator 410 has a positive temperature coefficient. That is, as the temperature increases, the frequency of the oscillating signal increases; and as the temperature decreases, the frequency of the oscillating signal decreases.

As an example, the supply voltage (Vcc−Vss) provided to the power supply generator 420 may be at a voltage region that would cause the ring oscillator 410 to operate in a mobility dominated temperature region if the supply voltage (Vcc−Vss) were to be applied directly to the voltage rails of the ring oscillator 410. As an example, the supply voltage (Vcc−Vss) may be at 1.0V. The supply voltage generator 420 generates reduced supply voltage (V+−V−) so that the ring oscillator 410 is configured to operate in a threshold voltage Vth dominated temperature region. As an example, the reduced supply voltage may be at 0.7V.

Thus, through the use of the supply voltage generator 420 in providing a reduced supply voltage (V+−V−) for the ring oscillator 410, the ring oscillator is configured to generate a signal with a frequency that has a more predictable variation with temperature (e.g., a positive temperature coefficient). Because the variation of the frequency with temperature is more predictable, temperature-compensating the frequency may be effectuated by providing a temperature-affecting parameter that counters the predictable variation of the frequency with temperature.

As discussed in more detail further herein, if, through the use of the reduced supply voltage (V+−V−), the ring oscillator 410 has a tendency to generate a signal with a frequency having a positive temperature coefficient, a temperature-compensating circuit provides another parameter so that the ring oscillator has a tendency to generate a signal having a negative temperature coefficient. The negative temperature coefficient may be configured to be substantially equal to the positive temperature coefficient over a defined operating temperature so that the ring oscillator generates a temperature-compensated signal over the defined operating temperature.

Figure 5:
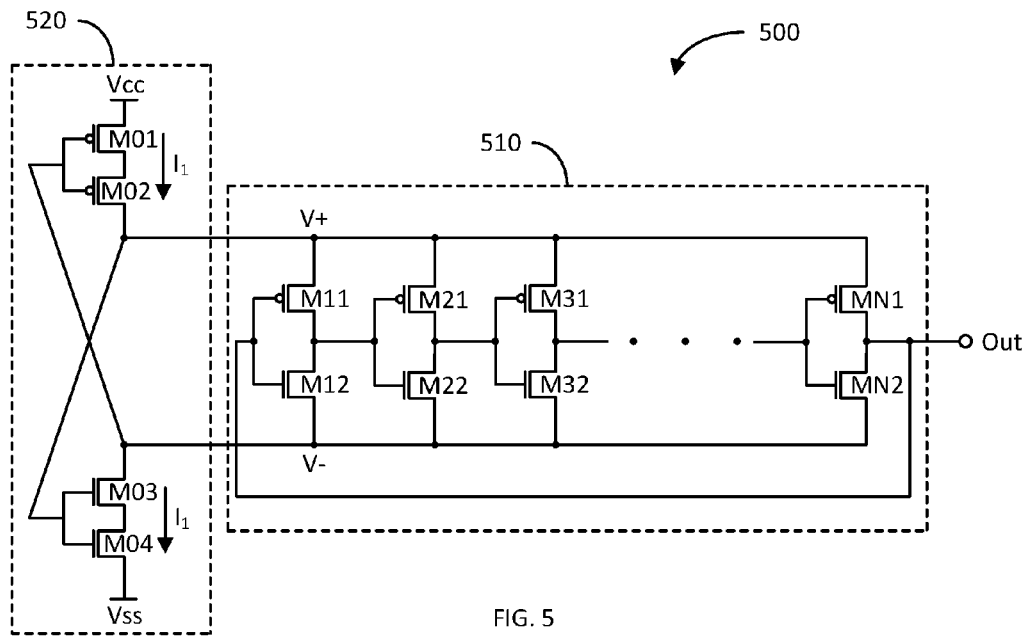
FIG. 5 illustrates a schematic diagram of another exemplary signal generator in accordance with another aspect of the disclosure.

FIG. 5 illustrates a schematic diagram of another exemplary signal generator 500 in accordance with another aspect of the disclosure. The signal generator 500 may be one example of a detailed implementation of the signal generator 400 previously discussed. As with signal generator 400, a first aspect of signal generator 500 is to configure a supply voltage applied to a ring oscillator so that the ring oscillator operates in a threshold voltage Vth dominated temperature dependency region.

In this regard, the signal generator 500 includes a ring oscillator 510 having a set of inverters as indicated by transistor-pairs M11-M12, M21-M22, M31-M32 to MN1-MN2, where N is an odd integer number. Each of the pairs of transistors is coupled in series between a first supply voltage rail V+ and a second supply voltage rail V−. The upper FETs M11 to MN1 may be configured as p-channel metal oxide semiconductor (PMOS) field effect transistors (FETs) (referred to herein as "PMOS"). The lower FETs M12 to MN2 may be configured as n-channel metal oxide semiconductor (NMOS) FETs (referred to herein as "NMOS").

The output of each of the inverters (at the drains of the corresponding PMOS-NMOS pair) is coupled to the input of the following adjacent inverter (at the gates of the corresponding PMOS-NMOS pair of the following adjacent inverter). The output of the last inverter (MN1-MN2) is coupled to the input of the first inverter (M11-M12).

The signal generator 500 further includes a supply voltage generator 520 configured to generate the first and second supply voltages V+ and V− based on third and fourth supply voltages (e.g., Vcc and Vss). The supply voltage generator 520 includes PMOS M01 and M02 coupled in series between the third voltage rail Vcc and the first voltage rail V+. The supply voltage generator 520 further includes NMOS M03 and M04 coupled in series between the second voltage rail V− and the fourth voltage rail Vss. The gates of PMOS M01 and M02 are both coupled to the second voltage rail V−, and the gates of NMOS M03 and M04 are both coupled to the first voltage rail V+.

In operation, the PMOS M01 and M02 produce IR losses due to a current $I_1$ drawn by the ring oscillator 510 to generate the first voltage V+ from the third supply voltage Vcc. Similarly, the NMOS M03 and M04 produce IR losses due to the current $I_1$ to generate the second voltage V− from the second supply voltage Vss. Accordingly, the supply voltage across the inverters (V+−V−) is lower than the supply voltage (Vcc−Vss) applied across the supply voltage generator 520.

The first and second rail voltages V+ and V− being coupled to the gates of PMOS M01-M02 and NMOS M03-M04, respectively, regulate the voltages V+ and V−. For instance, if the voltages V+ and V− increases above a desired operating point, the higher voltage V− controls the PMOS M01-M02 to increase its resistance and the higher voltage V+ controls NMOS M03-M04 to decrease its resistance. This has the effect of decreasing the voltages V+ and V− so that these voltages operate at the desired operating point. Similarly, if the voltages V+ and V− decrease to below the desired operating point, the lower voltage V− controls the PMOS M01-M02 to decrease its resistance and the lower voltage V+ controls NMOS M03-M04 to increase its resistance. This has the effect of increasing the voltages V+ and V− so that these voltages operate at the desired operating point.

Thus, the reduction of the effective supply voltage V+ and V− for the ring oscillator 510 causes the ring oscillator to consume less power, and also to operate in a temperature-dependent region where threshold voltage Vth of the devices M11 to MN2 dominate. The threshold voltage Vth varies inversely with temperature causing the frequency of the signal generated by the ring oscillator 510 to vary in the same direction as temperature (e.g., with a positive temperature coefficient).

Figure 6:
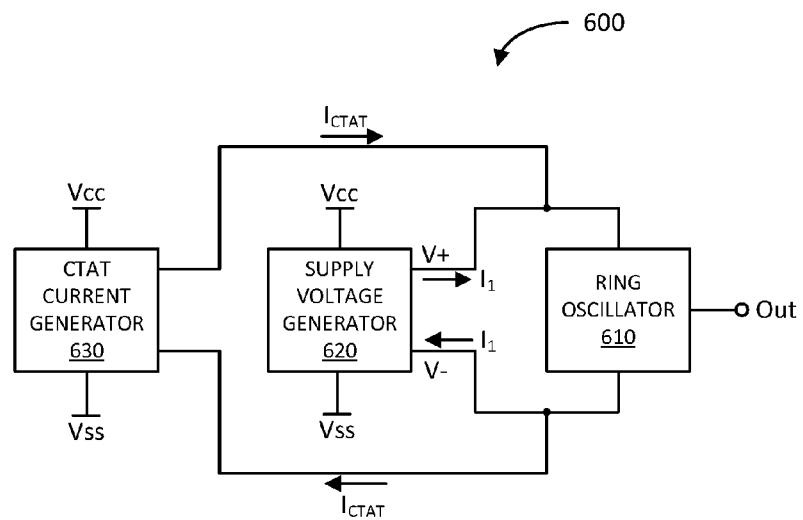
FIG. 6 illustrates a block diagram of yet another exemplary signal generator in accordance with another aspect of the disclosure.

FIG. 6 illustrates a block diagram of another exemplary signal generator 600 in accordance with another aspect of the disclosure. In summary, similar to signal generators 400 and 500, the signal generator 600 includes a power supply voltage generator to provide a supply voltage to a ring oscillator to configure the oscillator to operate in a threshold voltage Vth dominated temperature dependent region, where the frequency of the signal generated by the oscillator has a positive temperature coefficient. Additionally, the signal generator 600 includes a complementary to absolute temperature (CTAT) current generator configured to generate a CTAT current for the ring oscillator to counter the positive temperature coefficient of the frequency of the signal.

In particular, the signal generator 600 includes a ring oscillator 610, a supply voltage generator 620, and a CTAT current generator 630. The supply voltage generator 620 generates a supply voltage (V+, V−) for the ring oscillator 610. The supply voltage (V+, V−) configures the ring oscillator 610 to operate in a threshold voltage Vth dominated temperature dependent region, where the frequency of the signal generated by the oscillator has a positive temperature coefficient. The supply voltage generator 620 generates the supply voltage (V+, V−) based on another supply voltage (Vcc, Vss). As such, the ring oscillator 610 draws a current $I_1$ from the power supply generator 620.

The CTAT current generator 630 generates a current $I_{CTAT}$ that has a negative temperature coefficient. The current $I_{CTAT}$ is supplied to the ring oscillator 610 by way of its voltage rails. Thus, in addition to the current $I_1$ supplied to the ring oscillator 610 by the supply voltage generator 620, the $I_{CTAT}$ is provided to the ring oscillator 610 to temperature compensate the frequency of the signal generated by the ring oscillator.

For instance, the amount of current $I_{CTAT}$ provided to the ring oscillator 610 tends to increase the frequency of the signal generated by the oscillator. For example, the greater the current $I_{CTAT}$ supplied to the ring oscillator 610, the greater is the increase in frequency of the signal generated by the ring oscillator. Conversely, the lesser the current $I_{CTAT}$ supplied to the ring oscillator 610, the lesser is the increase in frequency of the signal generated by the ring oscillator.

The temperature compensation operates as follows. Without supplying the current $I_{CTAT}$ to the ring oscillator 610, the ring oscillator generates a signal with a frequency having a positive temperature coefficient. Thus, an increase in temperature produces an increase in the frequency of the signal, whereas a decrease in temperature produces a decrease in the frequency of the signal.

By supplying the current $I_{CTAT}$ to the ring oscillator 610, an increase in temperature produces a smaller current $I_{CTAT}$ supplied to the oscillator, which has a tendency to decrease the frequency to counter the tendency for the frequency to increase with temperature due to threshold voltage Vth variation. Conversely, a decrease in temperature produces a larger current $I_{CTAT}$ supplied to the oscillator, which has a tendency to increase the frequency to counter the tendency for the frequency to decrease with temperature due to threshold voltage Vth variation.

Thus, through the use of the CTAT current generator 630, the frequency of the signal generated by the ring oscillator 610 may be temperature-compensated (e.g., varies less with temperature compared to a circuit that does not supply the ring oscillator with the $I_{CTAT}$ current).

Figure 7:
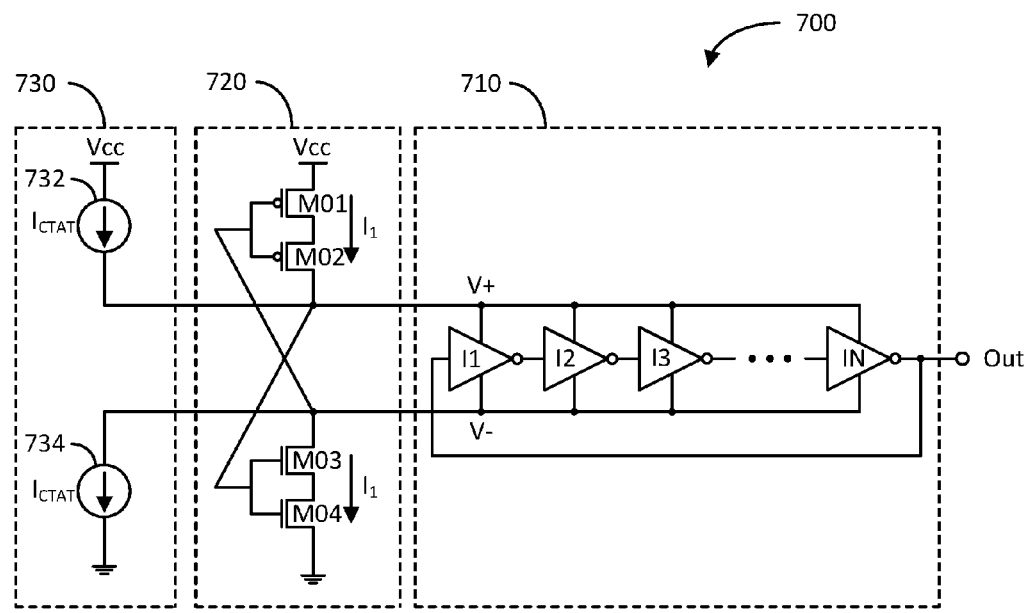
FIG. 7 illustrates a schematic diagram of still another exemplary signal generator in accordance with another aspect of the disclosure.

FIG. 7 illustrates a schematic diagram of another exemplary signal generator 700 in accordance with another aspect of the disclosure. The signal generator 700 may be one example of a detailed implementation of the signal generator 600 previously discussed. Similar to signal generator 600, signal generator 700 includes a ring oscillator 710 and a supply voltage generator 720 for generating rail voltages V+ and V− for the ring oscillator 710. With the rail voltages V+ and V−, the temperature-uncompensated frequency of the signal generated by the ring oscillator 710 varies in the same direction as temperature (e.g., with a positive temperature coefficient).

The ring oscillator 710 may be configured similar to that of ring oscillators 410 and 510 previously discussed. The supply voltage generator 720 may be configured similar to supply voltage generator 520 previously discussed.

The signal generator 700 includes a CTAT current generator 730 having a first current source 732 and a second current source 734. The first current source 732 is coupled between a third voltage rail Vcc and the first voltage rail V+. The first current source 732 is configured to generate a complementary to absolute temperature (CTAT) current $I_{CTAT}$. Similarly, the second current source 734 is coupled between the second voltage rail V− and the fourth voltage rail Vss. The second current source 734 is configured to generate the CTAT current $I_{CTAT}$.

The temperature compensation operates as follows: By supplying the current $I_{CTAT}$ to the ring oscillator 710, an increase in temperature produces a smaller current $I_{CTAT}$ supplied to the oscillator, which has a tendency to decrease the frequency to counter the tendency for the frequency to increase with temperature due to threshold voltage Vth variation. Conversely, a decrease in temperature produces a larger current $I_{CTAT}$ supplied to the oscillator, which has a tendency to increase the frequency to counter the tendency for the frequency to decrease with temperature due to threshold voltage Vth variation.

Figure 8:
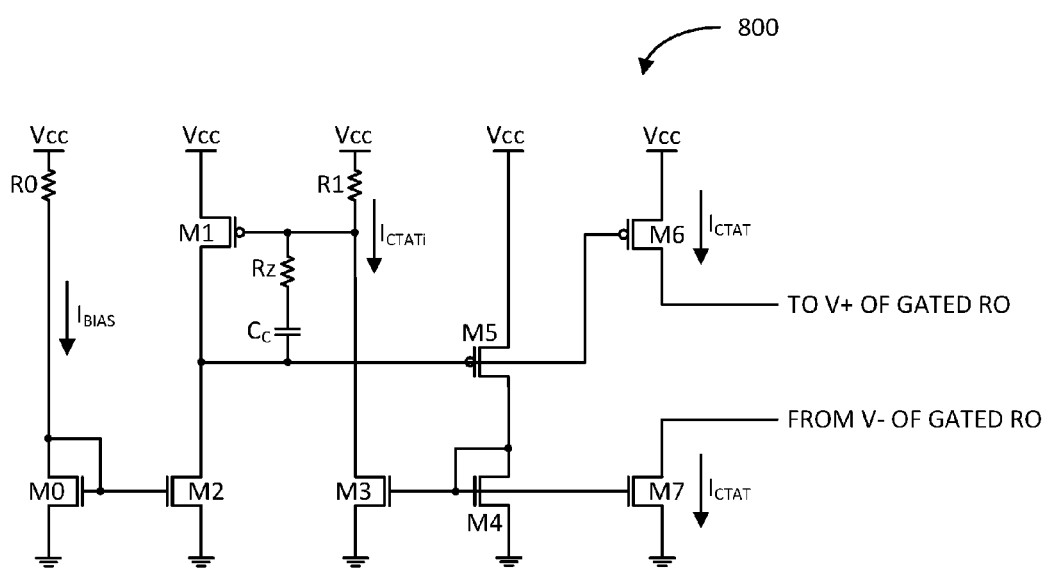
FIG. 8 illustrates a schematic diagram of an exemplary complementary to absolute temperature (CTAT) current generator in accordance with another aspect of the disclosure.

FIG. 8 illustrates a schematic diagram of an exemplary temperature-compensating circuit 800 in accordance with another aspect of the disclosure. The circuit 800 includes a bias circuit having resistor R0 coupled in series with NMOS M0 between a first voltage rail Vcc and a second voltage rail Vss (e.g., ground). The gate and drain of NMOS M0 are coupled together so that the bias circuit generates a substantially constant current $I_{BIAS}$.

The circuit 800 further includes a current-mirror in the form of NMOS M2 configured to have the same gate-to-source voltage as NMOS M0. Accordingly, the current mirror produces a current related to (substantially the same if M2 and M0 are substantially the same size or scaled by the ratio of the size of M2 to the size of M0) $I_{BIAS}$ through PMOS M1 and NMOS M2. The current through PMOS M1 biases the device M1 to operate with a sub-threshold gate-to-source voltage (Vgs) (e.g., Vgs<Vth). The sub-threshold Vgs has a negative temperature coefficient (e.g., the Vgs of PMOS M1 is a CTAT voltage).

The same Vgs voltage is also across the resistor R1, which produces an intermediate current $I_{CTATi}$ through the resistor R1 that is proportional to the Vgs of PMOS M1. Accordingly, the intermediate current $I_{CTATi}$ has a negative temperature coefficient. The intermediate current $I_{CTATi}$ is mirrored via the current mirror configuration of NMOS M3 and M4 to generate current $I_{CTAT}$ through PMOS M5. The current through PMOS M5 and NMOS M4 are mirrored to generate $I_{CTAT}$ current through PMOS M6 and M7, respectively. The current $I_{CTAT}$ through PMOS M6 and NMOS M7 is the injection current to temperature-compensate the frequency of the signal generated by the ring oscillators 610 and 710, as previously discussed.

The PMOS M5 and NMOS M4 and M3 operate as a negative feedback network to stabilize the intermediate current $I_{CTATi}$. The resistor $R_Z$ and capacitor $C_C$ also stabilizes the intermediate current $I_{CTATi}$ by preventing rapid changes of the intermediate current $I_{CTATi}$.

Figure 9:
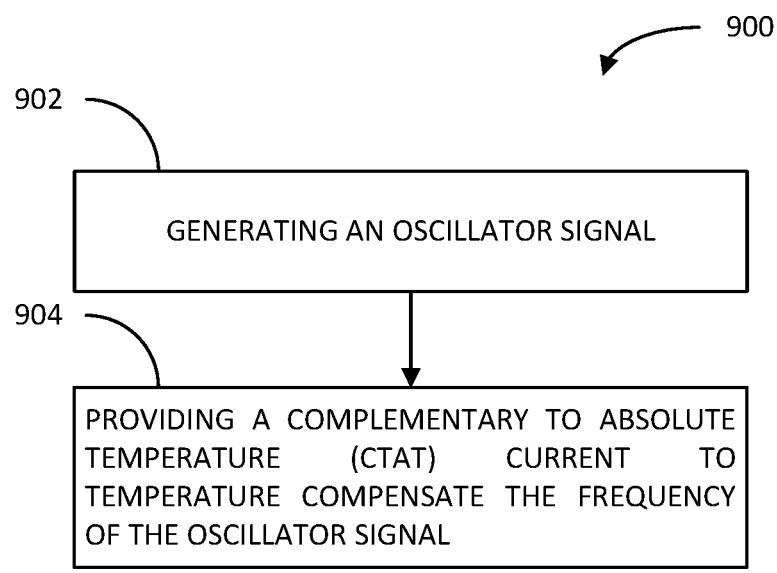
FIG. 9 illustrates a flow diagram of an exemplary method of generating a signal in accordance with another aspect of the disclosure.

FIG. 9 illustrates a flow diagram of an exemplary method 900 of generating a signal in accordance with another aspect of the disclosure. The method 900 includes generating an oscillator signal (block 902). As previously discussed, the ring oscillators described herein are examples of a means for generating an oscillating signal.

The method 900 further includes providing a complementary to absolute temperature (CTAT) current to temperature-compensate the frequency of the oscillating signal (block 904). As previously discussed, the CTAT current generators or temperature-compensating circuits described herein are examples of a means for providing a complementary to absolute temperature (CTAT) current to temperature-compensate the frequency of the oscillating signal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   an oscillator configured to generate an oscillating signal;
   a complementary to absolute temperature (CTAT) current generator configured to supply a CTAT current to the oscillator to temperature compensate a frequency of the oscillating signal;
   a supply voltage generator configured to generate a first supply voltage for the oscillator using a second supply voltage; and
   a frequency-to-digital converter (FDC) configured to generate a digital output code indicative of the second supply voltage in response to receiving the oscillating signal.

2. The apparatus of claim 1, wherein the second supply voltage is greater than the first supply voltage.

3. The apparatus of 1, wherein the CTAT current generator comprises:
   a resistor; and
   a CTAT voltage generator configured to generate a CTAT voltage across the resistor so that a current is produced through the resistor, wherein the CTAT current is based on the current.

4. The apparatus of claim 3, wherein the CTAT voltage generator comprises:
   a field effect transistor (FET); and
   a bias circuit configured to bias the FET such that a gate-to-source voltage of the FET is lower than a threshold voltage of the FET, wherein the CTAT voltage is based on the gate-to-source voltage of the FET.

5. The apparatus of claim 3, wherein the CTAT generator comprises a current mirror configured to generate the CTAT current based on the current.

6. The apparatus of claim 1, wherein the oscillator comprises a ring oscillator.

7. An apparatus of comprising:
   an oscillator configured to generate an oscillating signal;
   a complementary to absolute temperature (CTAT) current generator configured to supply a CTAT current to the oscillator to temperature compensate a frequency of the oscillating signal;
   a supply voltage generator configured to generate a first supply voltage for the oscillator using a second supply voltage, wherein the supply voltage generator comprises:
      a first set of one or more transistors coupled between a first voltage rail associated with the second supply voltage and a first voltage rail associated with the first supply voltage; and
      a second set of one or more transistors coupled between a second voltage rail associated with the first supply voltage and a second voltage rail associated with the second supply voltage.

8. The apparatus of claim 7, wherein the first set of one or more transistors includes a first control terminal coupled to the second voltage rail associated with the first supply voltage, and wherein the second set of one or more transistors includes a second control terminal coupled to the first voltage rail associated with the first supply voltage.

9. A method, comprising:
   generating an oscillating signal;
   providing a complementary to absolute temperature (CTAT) current to temperature-compensate a frequency of the oscillating signal;
   providing a first supply voltage for generating the oscillating signal, the first supply voltage being generated using a second supply voltage; and
   generating a digital output code indicative of the second supply voltage in response to receiving the oscillating signal.

10. The method of claim 9, wherein the second supply voltage is greater than the first supply voltage.

11. The method of 9, wherein generating the CTAT current comprises:
    generating a CTAT voltage; and
    applying the CTAT voltage across a resistor so that a current is produced through the resistor, wherein the CTAT current is based on the current.

12. The method of claim 11, wherein generating the CTAT current further comprises biasing a field effect transistor (FET) such that a gate-to-source voltage of the FET is lower than a threshold voltage of the FET, wherein the CTAT voltage is based on the gate-to-source voltage of the FET.

13. The method of claim 11, wherein generating the CTAT current comprises mirroring the current to generate the CTAT current.

14. The method of claim 9, wherein generating the oscillating signal comprises generating the oscillating signal using a ring oscillator.

15. A method comprising:
    generating an oscillating signal;
    providing a complementary to absolute temperature (CTAT) current to temperature-compensate a frequency of the oscillating signal;
    providing a first supply voltage for generating the oscillating signal, the first supply voltage being generated using a second supply voltage, wherein providing the first supply voltage comprises:
       controlling a first set of one or more transistors coupled between a first voltage rail associated with the second supply voltage and a first voltage rail associated with the first supply voltage; and
       controlling a second set of one or more transistors coupled between a second voltage rail associated with the first supply voltage and a second voltage rail associated with the second supply voltage.

16. The method of claim 15, wherein controlling the first set of one or more transistors comprises controlling the first set of one or more transistors based on a voltage at the second voltage rail associated with the first supply voltage, and wherein controlling the second set of one or more transistors comprises controlling the second set of one or more transistors based on another voltage at the first voltage rail associated with the first supply voltage.

17. An apparatus, comprising:
    means for generating an oscillating signal;
    means for providing a complementary to absolute temperature (CTAT) current to temperature-compensate a frequency of the oscillating signal;
    means for generating a first supply voltage for the means for generating the oscillating signal, the first supply voltage being generated using a second supply voltage; and
    means for generating a digital output code indicative of the second supply voltage in response to receiving the oscillating signal.

18. The apparatus of claim 17, wherein the second supply voltage is greater than the first supply voltage.

19. An apparatus comprising:

means for generating an oscillating signal;

means for providing a complementary to absolute temperature (CTAT) current to temperature-compensate a frequency of the oscillating signal;

means for generating a first supply voltage for the means for generating the oscillating signal, the first supply voltage being generated using a second supply voltage, wherein the means for providing the first supply voltage comprises:

means for controlling a first set of one or more transistors coupled between a first voltage rail associated with the second supply voltage and a first voltage rail associated with the first supply voltage; and means for controlling a second set of one or more transistors coupled between a second voltage rail associated with the first supply voltage and a second voltage rail associated with the second supply voltage.

20. The apparatus of claim 19, wherein the means for controlling the first set of one or more transistors comprises means for controlling the first set of one or more transistors based on a voltage at the second voltage rail associated with the first supply voltage, and wherein the means for controlling the second set of one or more transistors comprises means for controlling the second set of one or more transistors based on another voltage at the first voltage rail associated with the first supply voltage.

21. The apparatus of 21, wherein the means for generating the CTAT current comprises:

means for generating a CTAT voltage; and means for applying the CTAT voltage across a resistor so that a current is produced through the resistor, wherein the CTAT current is based on the current.

22. The apparatus of claim 21, wherein the means for generating the CTAT current further comprises means for biasing a field effect transistor (FET) such that a gate-to-source voltage of the FET is lower a threshold voltage of the FET, wherein the CTAT voltage is based on the gate-to-source voltage of the FET.

23. The apparatus of claim 21, wherein the means for generating the CTAT current comprises means for mirroring the current to generate the CTAT current.

24. The apparatus of claim 17, wherein the means for generating the oscillating signal comprises a ring oscillator.

* * * * *